United States Patent
Wiley

(10) Patent No.: US 9,144,181 B2
(45) Date of Patent: *Sep. 22, 2015

(54) COOLING COMPUTING ASSETS IN A DATA CENTER USING HOT AND COLD STACKS

(71) Applicant: Scott Wiley, Los Altos, CA (US)

(72) Inventor: Scott Wiley, Los Altos, CA (US)

(73) Assignee: Facebook, Inc., Menlo Park, CA (US)

( * ) Notice: Subject to any disclaimer, the term of this patent is extended or adjusted under 35 U.S.C. 154(b) by 210 days.

This patent is subject to a terminal disclaimer.

(21) Appl. No.: 13/673,895

(22) Filed: Nov. 9, 2012

(65) Prior Publication Data

US 2014/0133089 A1     May 15, 2014

(51) Int. Cl.
*H05K 7/20*     (2006.01)
*H01L 23/473*     (2006.01)

(52) U.S. Cl.
CPC .................................. *H05K 7/20745* (2013.01)

(58) Field of Classification Search
CPC ............. H05K 7/20; H05K 7/20218–7/20381; H05K 7/20409–7/20418; H05K 7/20009–7/202; H01L 23/473; H01L 23/367–23/3677; H01L 23/46–23/467; G06F 1/181–1/182
USPC ....................... 361/679.46–679.54, 688–727, 361/676–678; 165/80.1–80.5, 104.33, 185; 454/184; 257/712–722, E23.088; 174/15.1–15.3, 16.1–16.3, 547, 548; 24/453, 458–459; 312/236
See application file for complete search history.

(56) References Cited

U.S. PATENT DOCUMENTS

| | | | |
|---|---|---|---|
| 2005/0225936 A1* | 10/2005 | Day ............................ | 361/687 |
| 2007/0064391 A1* | 3/2007 | Lewis, II et al. ............. | 361/695 |
| 2007/0213000 A1* | 9/2007 | Day ............................ | 454/184 |
| 2008/0174954 A1* | 7/2008 | VanGilder et al. .......... | 361/687 |
| 2008/0204999 A1* | 8/2008 | Clidaras et al. .............. | 361/696 |
| 2009/0107652 A1* | 4/2009 | VanGilder et al. ........... | 165/80.2 |
| 2009/0168345 A1* | 7/2009 | Martini ........................ | 361/691 |
| 2009/0173473 A1* | 7/2009 | Day ............................ | 165/67 |
| 2009/0201640 A1* | 8/2009 | Bard et al. ................... | 361/694 |
| 2009/0207564 A1* | 8/2009 | Campbell et al. ............ | 361/688 |
| 2009/0251860 A1* | 10/2009 | Belady et al. ................ | 361/690 |
| 2009/0277605 A1* | 11/2009 | VanGilder et al. ........... | 165/67 |
| 2010/0154448 A1* | 6/2010 | Hay ............................. | 62/175 |
| 2010/0216388 A1* | 8/2010 | Tresh et al. .................. | 454/184 |
| 2010/0263830 A1* | 10/2010 | Noteboom et al. .......... | 165/80.2 |
| 2010/0304657 A1* | 12/2010 | Gallmann et al. ........... | 454/184 |
| 2011/0021134 A1* | 1/2011 | Zwern ......................... | 454/343 |
| 2011/0105015 A1* | 5/2011 | Carlson ....................... | 454/253 |
| 2011/0125452 A1* | 5/2011 | Bash et al. .................. | 702/130 |
| 2011/0128699 A1* | 6/2011 | Heydari et al. .......... | 361/679.48 |
| 2011/0278928 A1* | 11/2011 | Burger et al. ................ | 307/39 |
| 2012/0033368 A1* | 2/2012 | Archibald et al. ....... | 361/679.02 |
| 2012/0164929 A1* | 6/2012 | Meyer .......................... | 454/184 |
| 2013/0244563 A1* | 9/2013 | Noteboom et al. .......... | 454/250 |

* cited by examiner

*Primary Examiner* — Anthony Haughton
*Assistant Examiner* — Razmeen Gafur
(74) *Attorney, Agent, or Firm* — Fenwick & West LLP

(57) ABSTRACT

A data center includes a hot stack for exhausting heated air from the data center and a cold stack that cools intake air relative to the environment surrounding the data center. The temperature difference between air in the cold stack and the environment creates an airflow through the cold stack and into a cold aisle. This pressurizes the cold aisle, causing air to flow from the cold aisle across computing assets to a lower-pressure hot aisle. While flowing across the computing assets, the air absorbs heat generated by the computing assets. The temperature difference between the heated air and air outside the data center causes the heated air to flow through the hot stack and outside of the data center.

15 Claims, 2 Drawing Sheets

COOLING COMPUTING ASSETS IN A DATA CENTER USING HOT AND COLD STACKS

BACKGROUND

This invention relates generally to data centers, and more particularly to efficient cooling of computing devices within a data center.

Heat removal is an important consideration in computer system and data center design. As the number of computing assets deployed in a data center increases, heat generated by electronic components in the computing assets during operation also increases. Because the reliability of computing assets used by the data center decreases if they operate at a high temperature over time, a portion of the data center's power is used for cooling electronics in the computing assets. However, as the number of computing assets included in a data center increases, a greater portion of the power consumed by the data center is used to cool electronics within the computing assets.

Conventionally, computing assets in a data center are individually equipped with cooling systems to dissipate heat produced during operation. Commonly, each server includes a fan for dissipating heat generated during operation. However, these internal fans generally consume about 10%-15% of the power used by the computing assets, and also produce heat during operation, limiting their effectiveness. Additionally, a room in the data center housing the computing assets may also be cooled using methods such as air conditioning, using additional power for cooling.

SUMMARY

Embodiments of the invention reduce or eliminate the need for power drawing sources, such as fans or air conditioning systems, to cool computing assets in a data center. A compartment in a data center includes computing assets, such as servers, and receives air from a cold stack. Air from outside the data center enters the cold stack, which cools the air (e.g., the air entering the cold stack is wetted). This causes an airflow into the cold stack that pressurizes a cold aisle of the compartment, which is proximate to a first side of the computing assets. The air is directed across the computing assets, absorbing heat generated from the computing assets during operation.

The heated air is directed toward a hot stack which exhausts the heated air from the compartment. The height of the hot stack and the temperature difference between the heated air and the air outside of the data center create an air flow through the hot stack that directs the heated air out of the compartment. Hence, the hot stack creates airflow out of the compartment that depressurizes a portion of the compartment. For example, the computing assets are oriented so a first side is proximate to a cold aisle and a second side is proximate to a hot aisle. The hot stack is coupled to the hot aisle, and as air flows across the computing assets and absorbs heat, the heated air is directed out of the compartment via the hot stack, depressurizing the hot aisle. Similarly, the cold stack is coupled to the cold aisle, and directs air into the cold aisle, pressurizing the cold aisle.

In some embodiments, wind turbines may be placed in the path of the airflow through the compartment and/or from the compartment to the hot stack to generate power from the airflow. The power may be supplied to the computing assets or to other systems of the data center. In one embodiment, a sensor monitors air temperature, air pressure, and/or air flow and adjusts the intake of air into the compartment or the exhaust of air from the compartment based on the monitored data. For example, if the temperature near one or more computing assets reaches a threshold value or the airflow near one or more computing assets reaches a threshold flow rate, the sensor communicates with a control system, which generates a control signal increasing the airflow through the compartment or cooling the external air directed into the compartment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Data Center Architecture

Figure 1:
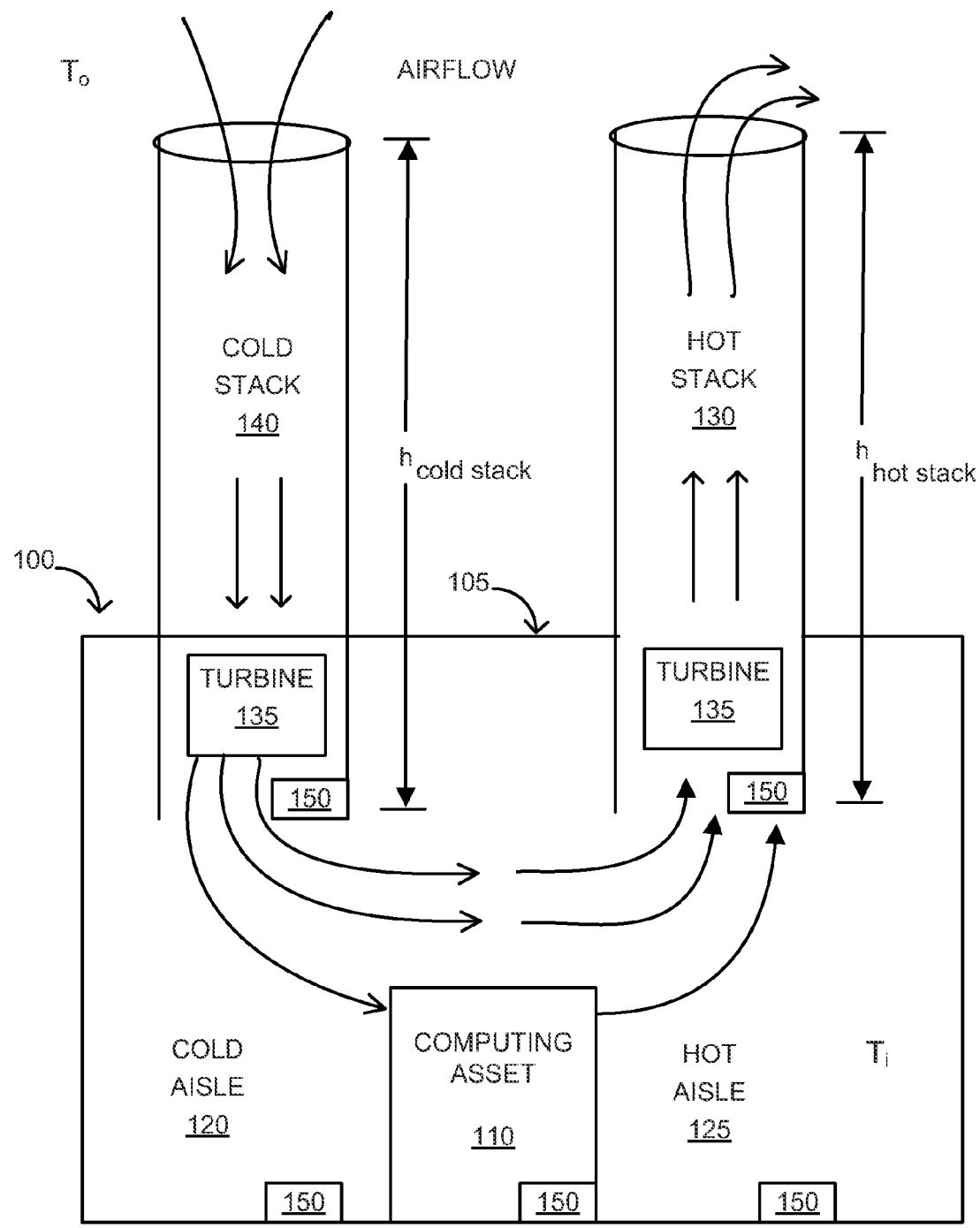
FIG. 1 is a side view of a data center for cooling computing assets by directing airflow through the data center using a cold stack and a hot stack in accordance with an embodiment of the invention.

An example data center 100 cooling one or more computing assets 110, such as servers, included in a compartment 105 is illustrated in FIG. 1. In one embodiment, air from outside of the data center 100 is directed into an input of a cold stack 140 that cools the received air. Any suitable method may be used to cool the air entering the cold stack 140. For example, a cooling system is positioned proximate to an input of the cold stack 140. The cooling system may use any suitable method for cooling the air. In one embodiment, the cooling system uses free-air cooling, such as air-side or liquid-side economization, to cool the air entering the cold stack 140 from outside the data center 100. In other embodiments, the cooling system may use other methods, such as evaporative cooling, absorption cooling, adsorption cooling, vapor-compression, or another method for extracting heat from air. Another example of such a cooling system is an injector system which introduces droplets of a liquid, such as water, to evaporatively cool the incoming air; the cold stack 140 may reduce the amount of atomization of the liquid cooling the incoming air. The cooling system may also modify the humidity of the cool air. For example, the cooling system may produce cold air having a humidity within a specified range, such as 20% to 60% humidity.

An opening of the cold stack 140 is coupled to a cold aisle 120, which is proximate to a first side of the computing assets 110. The cold stack 140 has an area and has a height determined from the distance between the opening of the cold stack 140 coupled to the cold aisle 120 and the input of the cold stack 140. In one embodiment, a filter is attached to the cold stack 140 proximate to the opening to remove particulates or other material from the air before it enters the cold aisle 120. For example, an electrostatic filter is positioned proximate to the opening to remove particulates from the air entering the cold aisle 120 from the cold stack 140. Cooling the air entering the input of the cold stack 140 causes the temperature of air within the cold stack 140 to be less than the temperature of air outside the cold stack 140. This temperature difference, along with the height and area of the cold stack 140, creates an airflow from the input of the cold stack 140 through the cold stack 140 and into the cold aisle 120, increasing the pressure of the cold aisle 120.

A second side of the computing assets 110 is proximate to a hot aisle 125. In some embodiments, the cold aisle 120 is partitioned from the hot aisle 125 so that the path of least resistance from the cold aisle 120 to the hot aisle 125 is through the computing assets 110. Because of the increased pressure in the cold aisle 120 from the cold stack 140, air flows from the cold aisle 120 across the computing assets 110 to the lower-pressure hot aisle 125. Passing across the computing assets 110 causes the air to absorb heat generated from operation of the computing assets 110.

A hot stack 130, such as a chimney or other structure with a height and an area, is fluidly connected to the hot aisle 125 and directs air from the hot aisle 125 to the exterior of the data center 100. Because the air in the hot aisle 125 is warmed from the heat generated by the computing assets 110, air in the hot aisle is less dense than the cooler air outside of the data center 100. This creates a "stack effect," which generally refers to an airflow resulting from a positive pressure area and one end of a structure, such as the hot stack 130 or the cold stack 140, and a negative pressure area at the opposing end of the structure. The pressure difference creating the stack effect may be calculated using the following equation:

$$\Delta P = Cah\left(\frac{1}{T_o} - \frac{1}{T_i}\right),$$

where:
$\Delta P$=available pressure difference;
C=a constant, 0.0342 in SI units or 0.0188 in U.S. units;
a=atmospheric pressure;
h=height or distance of the structure;
$T_o$=absolute outside temperature;
$T_i$=absolute inside temperature.

The airflow rate caused by the stack effect, which describes the airflow rate through the hot stack 130, and through the cold stack 140, is calculated using:

$$Q = CA\sqrt{2gh\frac{T_i - T_o}{T_i}},$$

where:
Q=stack effect draft flow rate;
A=flow area;
C=discharge coefficient (usually taken to be from 0.65 to 0.70);
g=gravitational acceleration;
h=height;
$T_i$=average air temperature inside a stack;
$T_o$=air temperature outside the stack.

As indicated by the arrows in FIG. 1, the stack effect causes air to flow from outside the data center 100 into the cold stack 140 (because the temperature inside the cold stack 140 and cold aisle 120 is less than the temperature of air outside the data center 100) and flow from the hot aisle 125 through the hot stack 130 and to the outside of the data center 100 (because the air temperature in the hot aisle 125 and hot stack 130 is greater than the temperature of air outside the data center 100). This airflow through the hot stack 130 reduces the pressure of the hot aisle 125 relative to the cold aisle 120, causing air to flow from the cold aisle 120 and across the computing assets 110 to the hot aisle 125. In some embodiments, the cold aisle 120 is partitioned from the hot aisle 125 so that the path of least resistance from the cold aisle 120 to the hot aisle 125 is through the computing assets 110.

The hot stack 130 is a structure, such as a chimney, that protruding from the data center 100 and coupled to the hot aisle 125 via an opening. The hot stack 130 has a height measured from a suitable reference point, such as from the opening, a surface of the data center 100, ground level, or any other suitable reference point. The height of the hot stack 130 may vary depending on the environment including the data center 100, operation of the computing assets 110, or any other suitable factors. Varying the heights of the hot stack 130 and of the cold stack 140 modifies the pressure difference between the hot aisle 125 and the cold aisle 120. Including both the hot stack 130 and the cold stack 140 allows the heights of the hot stack 130 and cold stack 140 to be reduced without affecting air flow from the cold aisle 120 to the hot aisle 125. For example, having at least a 62-foot high cold stack 140 and at least a 62-foot high hot stack 130 allows air to flow from the cold aisle 120 to the hot aisle 125 without the aid of air moving devices.

In some embodiments, a heat absorbent coating may be applied to the hot stack 130 to increase the temperature of air in the hot stack 130 by absorbing heat from the environment surrounding the data center 100. For example, the hot stack 130 may be painted black to increase an amount of solar energy absorbed by the hot stack 130. Similarly, plants may be affixed to the cold stack 140 to reduce the temperature of air in the cold stack 140.

In some embodiments, the data center 100 includes one or more turbines 135 generating power from the flow of air through the hot stack 130, through the cold stack 140 and/or through the compartment 105. Power generated by the one or more turbines 135 may be used to power the computing assets 110 and/or other components of the data center 100. In one embodiment, turbines 135 are located along a path which air flows from the hot aisle 125 to the hot stack 130. In other embodiments, the wind turbines 135 are included in the hot stack 130. Alternatively, turbines 135 are included in the cold stack 140 or along a path which air flows from the cold stack 140 to the cold aisle 120.

In different embodiments, the flow of air through the data center 100 may be statically or dynamically controlled. If air flow is statically controlled, the opening from the cold stack 140 to the cold aisle 120 may be louver-based and provides cooler air in different directions, at different flow rates, and/or at different temperature levels. Alternatively, the opening from the cold stack 140 to the cold aisle 120 may include one or more control systems for dynamically modifying the airflow provided to the cold aisle 120 from the cold stack 140 by changing the speed of one or more supply fans, repositioning one or more air supply louvers (or otherwise redirecting the airflow), or changing the temperature to which the airflow is cooled.

The data center 100 may include one or more sensors 150 in locations where air flows through from the cold aisle 120 to the hot aisle 125. The sensors 150 may be included in additional locations as well, such as external to the data center 100, proximate to the cold stack 140, proximate to the opening form the cold stack 140 to the cold aisle 120, within the cold stack 140, proximate to the opening of the hot stack 130, within the hot stack 130, proximate to the computing assets 110, or any other suitable locations. The sensors 150 may monitor any relevant air characteristic, such as, air flow, air temperature, air humidity, absolute air pressure, differential air pressure, or any other data describing air flow or air temperature proximate to a sensor location, and combinations thereof. In another embodiment, sensors 150 are positioned at locations within the cold aisle 120, at locations within the hot aisle 125, at locations within one or more servers 105, at locations within the hot stack 130, at locations within the cold stack 140, or in any combination of the above-described locations.

The sensors 150 communicate with a control system coupled to, or included in, the air intake system and/or a cooling system to modify how air is directed into the data center 100 or how air provided to the compartment 105 is cooled. The control system generates a control signal responsive to data from one or more sensors 150 to modify operation of the opening from the cold stack 140 to the cold aisle 120 or to modify a cooling system. For example, responsive to detecting a temperature reaching a threshold value, an air flow reaching a threshold flow rate, or a pressure difference between the hot aisle 125 and the cold aisle 120 falling below a threshold value, a sensor 150 communicates with the control system, which generates a control signal increasing the rate at which air is directed into the cold aisle 120 or modifying a characteristic of air supplied to the cold aisle 120. Hence, the sensors 150 and control system implement a feedback loop allowing the data center 100 to modify airflow through the compartment 105 responsive to changes in the exterior environment or in the data center environment, improving cooling of the computing assets 110. In embodiments including turbines 135 generating power from airflow, the control system may also regulate the amount of power generated and/or how the generated power is distributed to data center 100 components.

Figure 2:
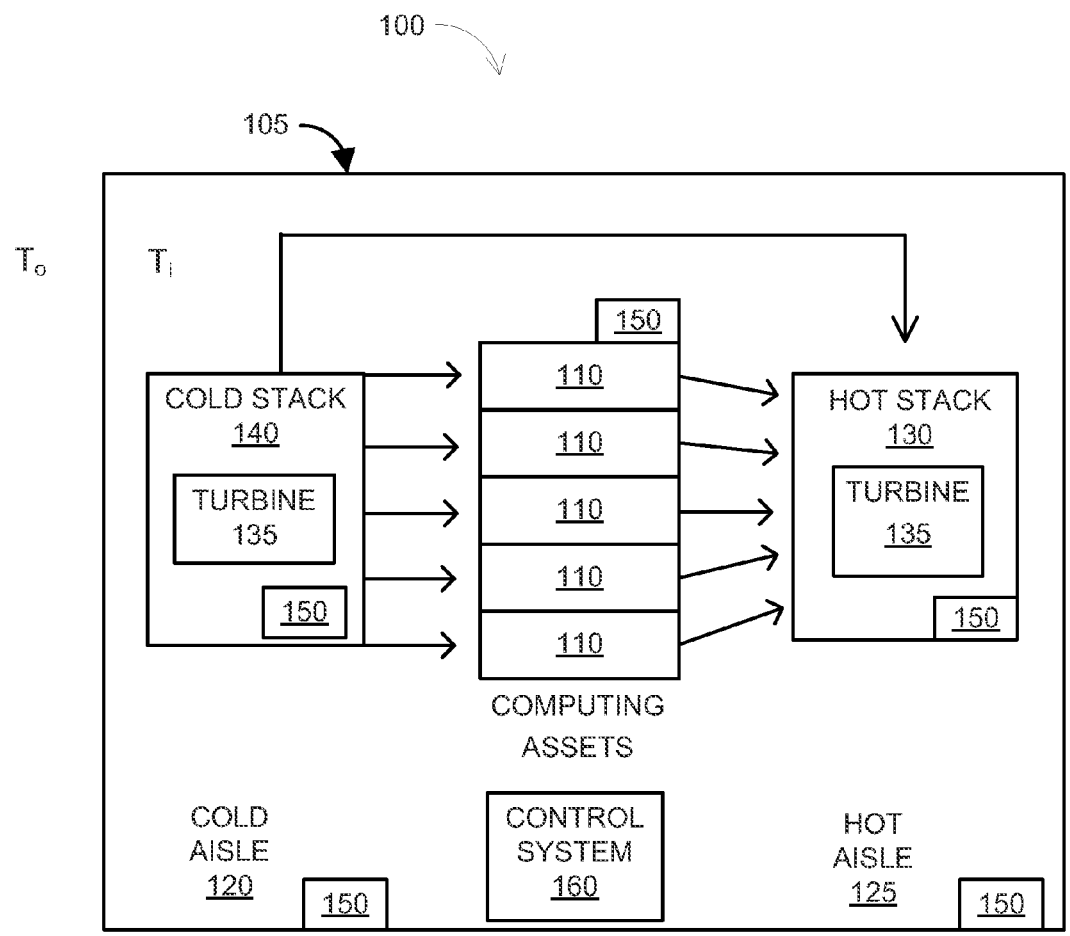
FIG. 2 is an overhead view of a data center for cooling computing assets by directing airflow through the data center using a cold stack and a hot stack in accordance with an embodiment of the invention.

FIG. 2 is a top view of the airflow in one embodiment of a compartment 105 of a data center 100 directing airflow through the compartment 105 using a stack effect from a hot stack 130 and from a cold stack 140. The arrows in FIG. 2 indicate the flow of air throughout the compartment 105. As illustrated, air from outside the data center 100 enters a cold stack 140, where the air is cooled so air inside the cold stack 140 is cooler than air outside the data center 100. This temperature difference, along with the height and area of the cold stack 140, causes air to flow through the cold stack and into the cold aisle 120, pressurizing the cold aisle 120.

Air flows from the cold aisle 120 to the lower pressure hot aisle 125, flowing across the computing assets 110 and absorbing heat from the computing assets 110. This increases the temperature of the air so it is higher than air outside the data center 100. This temperature difference and a height of the hot stack 130 causes air to flow from the hot aisle 125 through the hot stack 130 and outside of the compartment 105. This depressurizes the hot aisle 125 relative to the cold aisle 120, maintaining air flow from the cold aisle 120 over the computing assets 110 to the hot aisle 125, or increasing the rate at which air flows from the cold aisle 120 to the hot aisle 125. While FIGS. 1 and 2 shows a single cold stack 140 and a single hot stack 130, other embodiments may have multiple cold stacks 140 and/or multiple hot stacks 130.

As used herein, "cold air" or "cooler air" may refer to air having a temperature less than an ambient air temperature, air having a temperature below a specified temperature, or air having a lower relative temperature than air in a different region. For example, cold stack air can be referred to as "cold" or "cooler" air, when compared to the higher temperature of the air in the compartment 105 housing the operating computing assets 110 or the hot stack 130. As another example, air included in the cold aisle 120, referred to as "cold air," has a first temperature, while air included in the hot aisle 125, referred to as "hot air," has a second temperature that is higher than the first temperature.

While embodiments configured to include a cold aisle and a hot aisle are described above, the techniques described above may be applied to generate an airflow inside other data center configurations to cool computing assets included in a data center. For example, the preceding techniques may be applied to any suitable data center configuration to provide an airflow from a portion of the data center to another portion of the data center. Additionally the techniques described above may be used in other cooling scenarios to provide an airflow across devices to extract heat from the devices.

For example, in one embodiment, a heat conductive element, such as a cold plate or cooling fin, is thermally coupled to one or more heat generating devices in the data center. The heat conductive element is configured to absorb heat generated during operation of the servers and other equipment in the data center, but it is not in fluidic connection with the equipment. In an embodiment, rather than using the ambient air flowing from a cold aisle through the servers to a hot aisle to cool the equipment, the air from, e.g., a cold stack is directed through the heat conductive element. This cooling airflow extracts heat from the equipment, and the heated air then exits the data center via an exhaust, such as a hot stack. This cooling airflow is thus open to the atmosphere, whereas any airflow within the equipment is part of a closed loop. This embodiment may provide a lower resistance to the cooling airflow, thereby lowering the requirements of the hot stack and/or any fans in the path to generate the airflow necessary for proper cooling. This may also reduce or eliminate the need for filters, as the external air does not come into direct contact with the servers, which further lowers the resistance of the airflow path and reduces costs associated with maintaining the filters. In some embodiments, the heat conductive element can be part of the rack in which the servers are mounted or can be part of the servers themselves. In further embodiments, the path of airflow may also include a fan to facilitate the exhaust of heated air from the data center.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium, which include any type of tangible media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A data center system comprising:
   a plurality of computing assets included in a compartment, each computing asset having a first side oriented toward a cold aisle and having a second side oriented toward a hot aisle, the hot aisle having a lower pressure relative to the cold aisle so that air flows from the cold aisle to the hot aisle across the computing assets;
   a cold stack coupled to the cold aisle and comprising a cooling system, the air from outside the data center system entering the cold stack through an input and being cooled by the cooling system to a temperature lower than a temperature of the air outside the data center system, the cold stack having a height sufficient to cause air to flow through the cold stack when there is a temperature difference between the cooled air in the cold stack and the air outside the data center system, the rate of the air flow through the cold stack based on the height;
   a hot stack coupled to the hot aisle via an opening, the hot stack extending outside of the data center and having a height from the opening sufficient to, at a temperature difference between a temperature of air in the hot aisle and a temperature of the air outside to the data center, create a pressure difference that that causes air to flow from the hot aisle through the opening and into the hot stack.

2. The data center system of claim 1, wherein air from the hot aisle flows through the opening and flows through the hot stack at a rate based in part on the height of the hot stack and an area of the hot stack.

3. The data center system of claim 1, wherein the rate air flows through the cold stack is further based on an area of the cold stack.

4. The data center system of claim 1, further comprising one or more turbines included in the compartment and positioned along a flow of air from the hot aisle through the opening to the hot stack, the one or more turbines configured to generate power from the flow of air.

5. The data center system of claim 1, further comprising one or more turbines included in the hot stack, the one or more turbines configured to generate power from air flowing through the hot stack.

6. The data center system of claim 1, further comprising one or more turbines included in the compartment and positioned along a flow of air from the cold stack to the cold aisle, the one or more turbines configured to generate power from the flow of air.

7. The data center system of claim 1, further comprising one or more turbines included in the cold stack, the one or more turbines configured to generate power from air flowing through the cold stack.

8. The data center system of claim 1, further comprising a screen positioned between the cold stack and the cold aisle, the screen configured to remove particulates from air flowing from the cold stack to the cold aisle.

9. The data center system of claim 1, wherein the cooling system is selected from the group consisting of: an evaporative cooling system, an absorption cooling system, an adsorption cooling system, a vapor-compression cooling system, and any combination thereof.

10. A method comprising:
    operating a plurality of computing assets arranged so a first side of the computing assets are oriented toward a cold aisle of a compartment in a data center and a second side of the computing assets are oriented toward a hot aisle of the compartment;
    directing air external to the data center into a cold stack coupled to the cold aisle through an input of the cold stack;
    pressurizing the cold aisle relative to the hot aisle by cooling the air directed into the cold stack to a temperature less than a temperature of the air external to the data center to generate an air flow from outside the data center through the cold stack and into the cold aisle; and
    depressurizing the hot aisle relative to the cold aisle by directing air from the hot aisle through a hot stack coupled to the hot aisle, the air from the hot aisle directed through the hot stack at a rate based on a difference between a temperature of air in the hot aisle and a temperature of the air external to the hot aisle and on a height of the hot stack.

11. The method of claim 10, wherein the air flow from outside the data center through the cold stack and into the cold aisle is based at least in part on a height of the cold stack.

12. The method of claim 10, wherein the air flow from outside the data center through the cold stack and into the cold aisle is based at least in part on an area of the cold stack.

13. The method of claim 10, wherein the rate at which air from the hot aisle is directed through the hot stack is based at least in part on an area of the hot stack.

14. The method of claim 10, further comprising:
    generating power from air directed from the hot aisle through the hot stack using one or more turbines included in the hot stack.

15. The method of claim 10, further comprising:
    generating power from the air flow from outside the data center through the cold stack and into the cold aisle using one or more turbines included in the cold stack.

* * * * *